(12) United States Patent
Kim et al.

(10) Patent No.: US 11,569,420 B2
(45) Date of Patent: Jan. 31, 2023

(54) WHITE LIGHT SOURCE AND ILLUMINATION APPARATUS FOR LIGHTING IN LITHOGRAPHY PROCESS

(71) Applicant: GLBTECH CO., LTD., Gyeonggi-do (KR)

(72) Inventors: Han Do Kim, Gyeonggi-do (KR); Byung Soon Kim, Gyeonggi-do (KR); Young Sik Choi, Gyeonggi-do (KR); Guen Ryeol Park, Gyeonggi-do (KR); Eun Mi Park, Jeollabuk-do (KR); Yong Sun Choi, Gyeonggi-do (KR)

(73) Assignee: GLBTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 17/291,966

(22) PCT Filed: Oct. 31, 2019

(86) PCT No.: PCT/KR2019/014594
§ 371 (c)(1),
(2) Date: May 6, 2021

(87) PCT Pub. No.: WO2020/101231
PCT Pub. Date: May 22, 2020

(65) Prior Publication Data
US 2022/0005982 A1    Jan. 6, 2022

(30) Foreign Application Priority Data

Nov. 14, 2018  (KR) .................. 10-2018-0139897

(51) Int. Cl.
*H01L 33/50* (2010.01)
*F21K 9/27* (2016.01)
(Continued)

(52) U.S. Cl.
CPC ........ *H01L 33/502* (2013.01); *C09K 11/7734* (2013.01); *F21K 9/27* (2016.08);
(Continued)

(58) Field of Classification Search
CPC ..... H01L 33/502; H01L 33/504; H01L 33/58; H01L 33/56; H01L 33/26; H01L 33/501;
(Continued)

(56) References Cited

U.S. PATENT DOCUMENTS

| | | |
|---|---|---|
| 2010/0195322 A1 | 8/2010 | Kawakami |
| 2011/0163322 A1 | 7/2011 | Yoo et al. |

(Continued)

FOREIGN PATENT DOCUMENTS

| | | |
|---|---|---|
| CN | 103946621 B | 2/2017 |
| CN | 106715442 A | 5/2017 |

(Continued)

OTHER PUBLICATIONS

Japanese Patent Abstract (in English) of JP Pub. No. 2004-253745 A, Pub. Date Sep. 9, 2004, downloaded on May 26, 2022 from http://worldwide.espacenet.com.

(Continued)

*Primary Examiner* — Anne M Hines
*Assistant Examiner* — Jose M Diaz
(74) *Attorney, Agent, or Firm* — Barcelo, Harrison & Walker, LLP

(57) ABSTRACT

The present invention relates to a white light source and illumination apparatus for limiting wavelength of 450 nm or less and, more particularly, to a white light source and illumination apparatus for lighting in a lithography or other process, capable of realizing white light even with the limited wavelength of 450 nm or less light. Disclosed is a white light illumination apparatus for limiting wavelength of 450 nm or less, the apparatus comprising a white light (Continued)

source comprising: a blue light-emitting diode element having an emission peak wavelength of 450-490 nm; and an encapsulation layer which encapsulates the blue light-emitting diode element, wherein in the encapsulation layer, one or more phosphors which realize white light emission along with the blue light-emitting diode element, and a blocking agent which blocks light of wavelength of 450 nm or less are scattered, thus forming a first peak region at a wavelength of 450-490 nm and a second peak region which realizes white light emission in combination with the first peak region and limiting the wavelength of 450 nm or less.

24 Claims, 17 Drawing Sheets

(51) Int. Cl.
    *C09K 11/77*     (2006.01)
    *H01L 33/26*     (2010.01)
    *H01L 33/56*     (2010.01)
    *H01L 33/58*     (2010.01)
    *F21Y 103/10*     (2016.01)
    *F21Y 115/10*     (2016.01)

(52) U.S. Cl.
    CPC .............. *H01L 33/26* (2013.01); *H01L 33/56* (2013.01); *H01L 33/58* (2013.01); *F21Y 2103/10* (2016.08); *F21Y 2115/10* (2016.08)

(58) Field of Classification Search
    CPC ... C09K 11/7734; F21K 9/27; F21Y 2103/10; F21Y 2115/10; G03F 7/70391; G03F 7/091; G03F 7/70141; G03F 7/70833
    See application file for complete search history.

(56) References Cited

U.S. PATENT DOCUMENTS

| | | |
|---|---|---|
| 2012/0146073 A1 | 6/2012 | Phipps et al. |
| 2014/0328048 A1 | 11/2014 | Streppel et al. |
| 2015/0316688 A1 | 11/2015 | Cefalo et al. |
| 2018/0051864 A1 | 2/2018 | Koehler et al. |
| 2019/0006563 A1 | 1/2019 | Sato et al. |
| 2019/0136129 A1 | 5/2019 | Moon et al. |

FOREIGN PATENT DOCUMENTS

| | | |
|---|---|---|
| EP | 1139440 A2 | 10/2001 |
| JP | 2004253745 A | 9/2004 |
| JP | 2009054989 A | 3/2009 |
| JP | 2013-098152 A | 5/2013 |
| JP | 2017139464 A | 8/2017 |
| KR | 10-2008-0094354 A | 10/2008 |
| KR | 10-2010-0037163 A | 4/2010 |
| KR | 10-2011-0085206 A | 7/2011 |
| KR | 10-2017-0026883 A | 3/2017 |
| KR | 10-2017-0123831 A | 11/2017 |
| KR | 10-2018-0009351 A | 1/2018 |
| KR | 10-2018-0021748 A | 3/2018 |
| KR | 10-2001548 B1 | 7/2019 |
| WO | 2011/090308 A2 | 7/2011 |

OTHER PUBLICATIONS

Japanese Patent Abstract (in English) of JP Pub. No. 2009-054989 A, Pub. Date Mar. 12, 2009, downloaded on May 26, 2022 from http://worldwide.espacenet.com.
Japanese Patent Abstract (in English) of JP Pub. No. 2017-139464 A, Pub. Date Aug. 10, 2017, downloaded on May 26, 2022 from http://worldwide.espacenet.com.
Examination Report, dated Mar. 8, 2022, for the India Patent Application No. 202127020243 (in English and in Indian Language).
Office Action, dated Apr. 26, 2022, issued by Japan Patent Office, for the JP Application No. 2021-513286 (in Japanese).
Korean Patent Abstract (in English) of KR Pub. No. 10-2010-0037163 A, Pub. Date Apr. 8, 2010, downloaded on Apr. 29, 2021 from http://worldwide.espacenet.com.
Korean Patent Abstract (in English) of KR Pub. No. 10-2008-0094354 A, Pub. Date Oct. 23, 2008, downloaded on Apr. 29, 2021 from http://worldwide.espacenet.com.
Korean Patent Abstract (in English) of KR Pub. No. 10-2011-0085206 A, Pub. Date Jul. 27, 2011, downloaded on Apr. 29, 2021 from http://worldwide.espacenet.com.
Korean Patent Abstract (in English) of KR Pub. No. 10-2017-0123831 A, Pub. Date Nov. 9, 2017, downloaded on Apr. 29, 2021 from http://worldwide.espacenet.com.
Korean Patent Abstract (in English) of KR Pub. No. 10-2001548 B1, Pub. Date Jul. 19, 2019, downloaded on Apr. 29, 2021 from http://worldwide.espacenet.com.
Chinese Patent Abstract (in English) of CN Pub. No. 103946621 B, Pub. Date Feb. 22, 2017, downloaded on Apr. 29, 2021 from http://worldwide.espacenet.com.
Chinese Patent Abstract (in English) of CN Pub. No. 106715442 A, Pub. Date May 24, 2017, downloaded on Apr. 29, 2021 from http://worldwide.espacenet.com.
Japanese Patent Abstract (in English) of JP Pub. No. 2013-098152 A, Pub. Date May 20, 2013, downloaded on Apr. 29, 2021 from http://worldwide.espacenet.com.
Korean Patent Abstract (in English) of KR Pub. No. 10-2017-0026883 A, Pub. Date Mar. 9, 2017, downloaded on Apr. 30, 2021 from http://worldwide.espacenet.com.
Korean Patent Abstract (in English) of KR Pub. No. 10-2018-0009351 A, Pub. Date Jan. 26, 2018, downloaded on Apr. 30, 2021 from http://worldwide.espacenet.com.
Korean Patent Abstract (in English) of KR Pub. No. 10-2018-0021748 A, Pub. Date Mar. 5, 2018, downloaded on Apr. 30, 2021 from http://worldwide.espacenet.com.
Office Action, dated Apr. 3, 2019, issued by Korean Intellectual Property Office, in App. No. 10-2018-0139897 (in Korean).
Office Action, dated Sep. 11, 2020, issued by Korean Intellectual Property Office, in App. No. 10-2019-0054641 (in Korean).
International Search Report, dated Feb. 7, 2020, for the International Application No. PCT/KR2019/014594 (in English).
Office Action, dated Mar. 16, 2021, issued by Taiwan Intellectual Property Office, in App. No. 108141085 (in Chinese).

Porphyrin – vanadium (1:1)

| | |
|---|---|
| Molecular Formula | $C_{20}H_{14}N_4V$ |
| Average mass | 361.293 Da |
| Monoisotopic mass | 361.065796 Da |
| ChemSpider ID | 29434438 |

⌘ -Double-bond stereo

| | | | | | | | | | |
|---|---|---|---|---|---|---|---|---|---|
| (1) | BLUE LED CHIP 450~480nm | wd | BLOCKING AGENT 0% | 1 TO 10% OF BLOCKING AGENT IS USED | | FIRST PHOSPHOR | SECOND PHOSPHOR | THIRD PHOSPHOR | BLOCKING AGENT | SILICONE |
| | | spectrum | 0.9913 | 0.1662 | | 81.0 | 0.0 | 15.0 | 4.0 | 100 |
| | | 450nm cut | 0.87% | 99.36% | | | 7.6% | | | 92.4% |

5000~6000K

| | | | | | | FIRST PHOSPHOR | SECOND PHOSPHOR | THIRD PHOSPHOR | BLOCKING AGENT | SILICONE |
|---|---|---|---|---|---|---|---|---|---|---|
| (2) | BLUE LED CHIP 460~470nm | wd | BLOCKING AGENT 0% | 1 TO 10% OF BLOCKING AGENT IS USED | | 82.5 | 0.0 | 15.0 | 2.5 | 100 |
| | | spectrum | 0.3229 | 0.1052 | | | 5.6% | | | 94.4% |
| | | 450nm cut | 87.71% | 99.49% | | | | | | |

2700~4000K

| | | | | | | FIRST PHOSPHOR | SECOND PHOSPHOR | THIRD PHOSPHOR | BLOCKING AGENT | SILICONE |
|---|---|---|---|---|---|---|---|---|---|---|
| (3) | BLUE LED CHIP 470~480nm | wd | BLOCKING AGENT 0% | 1 TO 10% OF BLOCKING AGENT IS USED | | 83.5 | 0.0 | 15.0 | 1.5 | 100 |
| | | spectrum | 0.0695 | 0.0037 | | | 8.2% | | | 91.8% |
| | | 450nm cut | 92.05% | 99.63% | | | | | | |

5000~6000K

| | | | | | | FIRST PHOSPHOR | SECOND PHOSPHOR | THIRD PHOSPHOR | BLOCKING AGENT | SILICONE |
|---|---|---|---|---|---|---|---|---|---|---|
| (4) | BLUE LED CHIP 470~480nm | wd | BLOCKING AGENT 0% | 1 TO 10% OF BLOCKING AGENT IS USED | | 0.0 | 95.9 | 2.1 | 2.0 | 100 |
| | | spectrum | 0.0695 | 0.0064 | | | 4.4% | | | 95.6% |
| | | 450nm cut | 93.05% | 99.36% | | | | | | |

6000~7000K

| | | | | | | FIRST PHOSPHOR | SECOND PHOSPHOR | THIRD PHOSPHOR | BLOCKING AGENT | SILICONE |
|---|---|---|---|---|---|---|---|---|---|---|
| (5) | BLUE LED CHIP 480~490nm | wd | BLOCKING AGENT 0% | 1 TO 10% OF BLOCKING AGENT IS USED | | 83.5 | 0.0 | 15.0 | 1.5 | 100 |
| | | spectrum | 0.0461 | 0.0038 | | | 5.0% | | | 95.0% |
| | | 450nm cut | 93.05% | 99.42% | | | | | | |

6000~7000K

| | | | | | | FIRST PHOSPHOR | SECOND PHOSPHOR | THIRD PHOSPHOR | BLOCKING AGENT | SILICONE |
|---|---|---|---|---|---|---|---|---|---|---|
| (6) | BLUE LED CHIP 480~490nm | wd | BLOCKING AGENT 0% | 1 TO 10% OF BLOCKING AGENT IS USED | | 84.0 | 0.0 | 15.0 | 1.0 | 100 |
| | | spectrum | 0.0027 | 0.0027 | | | 5.4% | | | 94.6% |
| | | 450nm cut | 95.97% | 99.73% | | | | | | |

5000~6000K

| | | | | | | FIRST PHOSPHOR | SECOND PHOSPHOR | THIRD PHOSPHOR | BLOCKING AGENT | SILICONE |
|---|---|---|---|---|---|---|---|---|---|---|
| (7) | BLUE LED CHIP 480~490nm | wd | BLOCKING AGENT 0% | 1 TO 10% OF BLOCKING AGENT IS USED | | 3.0 | 95.5 | 0.0 | 1.5 | 100 |
| | | spectrum | 0.0413 | 0.0067 | | | 4.5% | | | 95.5% |
| | | 450nm cut | 95.97% | 99.33% | | | | | | |

WHITE LIGHT SOURCE AND ILLUMINATION APPARATUS FOR LIGHTING IN LITHOGRAPHY PROCESS

CROSS-REFERENCE TO RELATED APPLICATIONS

This application is the national stage for International Patent Cooperation Treaty Application PCT/KR2019/014594 filed 31 Oct. 2019, which claims priority from Korean Patent Application No. 10-2018-0139897 filed 14 Nov. 2018, in the Korean Intellectual Property Office. The entire contents of said applications are incorporated herein by reference for all purposes.

BACKGROUND

Technical Field

The present invention relates to a white light source and illumination apparatus and, more particularly, to a white light source and illumination apparatus for lighting in a lithography or other process, capable of realizing white light even with the limited wavelength of 450 nm or less light.

Background Art

A lithography process of forming a circuit pattern by exposing a photoresist is performed to manufacture a semiconductor, a PCB, and the like. A lighting installed in an exposure room in which the lithography process is performed to manufacture the semiconductor and the PCB need not emit light with a wavelength that reacts with the photoresist used for the lithography process.

More specifically, the lithography process for the semiconductor forms a circuit pattern by using light with a wavelength of 450 nm or less (e.g., g-rays (436 nm), i-rays (365 nm), KrF excimer laser beams (248 nm), ArF excimer laser beams (193 nm), etc.) in accordance with product characteristics. For this reason, in order to prevent a defect from occurring in the lithography process, the wavelength is limited to 450 nm or less in the exposure room in which the lithography process is performed in a semiconductor and PCB manufacturing line in the related art.

More specifically, in the related art, there is used a lighting including a white fluorescent lamp configured to emit light with a wavelength of 400 to 700 nm used for the lithography process, and the white fluorescent lamp is covered with a film or a plastic cover that blocks light with a wavelength of 450 nm. In this case, the film or the plastic cover has a yellow color and implements a yellow lighting environment, as can be seen from FIG. 1A, such that the lithography process is called a yellow process.

More specifically, as illustrated in FIG. 2, in a fluorescent lamp 400 for an exposure room in the related art that emits yellow light, light is emitted by high-voltage mercury discharge from an electrode 420 provided at an end of a body 410 configured by a glass tube, and a wavelength shielding film 430, which surrounds the body 410, blocks light in a specific wavelength range (i.e., a wavelength range of 450 nm or less) when the light is emitted. As a result, there is no obstacle to the lithography process because the light does not react with the photoresist even though the fluorescent lamp 400 is applied to the exposure room.

However, the fluorescent lamp 400 for an exposure room in the related art has problems in that environmental pollution is caused because the mercury 440 is contained in the body 410, a lifespan of the fluorescent lamp 400 cannot be maintained for a long period of time because an emitter applied onto the electrode 420 is evaporated during the high-voltage discharge process, and there is a risk that the wavelength shielding film 430 surrounding the body 410 causes a light reaction as time elapsed and light in the wavelength range, which needs to be blocked, leaks.

Furthermore, in the case of the fluorescent lamp 400 for an exposure room in the related art, a process of mounting the wavelength shielding film 430 is additionally required, which causes an increase in unit price. In particular, the yellow lighting in the lithography process may cause problems such as an increase in fatigue of operators, a deterioration in workability and efficiency, and a deterioration in visibility when the operator is exposed to the yellow lighting over a long period of time. Accordingly, various related companies have continuously attempted to implement white lighting that may be applied to the lithography process but have not yet proposed an appropriate solution to the above-mentioned problems.

DISCLOSURE

Technical Problem

The present invention has been made in an effort to solve the above-mentioned problems in the related art, and an object of the present invention is to provide a white light source and an illumination apparatus for lighting in a lithography or other process, which are capable of implementing white light while limiting light wavelength of 450 nm or less.

Technical Solution

In order to achieve the above-mentioned technical objects, a white-light illumination apparatus for limiting wavelength of 450 nm or less according to the present invention includes a white light source including: a blue light-emitting diode element having an emission peak wavelength of 450 nm to 490 nm; and an encapsulation layer configured to encapsulate the blue light-emitting diode element, in which one or more phosphors, which implement white light emission together with the blue light-emitting diode element, and a blocking agent, which blocks light of wavelength of 450 nm or less, are distributed in the encapsulation layer to limit the wavelength of 450 nm or less while forming a first peak region at a wavelength of 450 nm to 490 nm and a second peak region combined with the first peak region to implement the white light emission.

In this case, the blocking agent may include a chemical material selected from a porphyrin-based material, a phthalocyanine-based mount, and a coumarin-based material that comprise carbon (C), hydrogen (H), and nitrogen (N) as basic elements.

In addition, the blocking agent may include a metallic material together with the chemical material.

In this case, the metallic material may include one or two of vanadium (V), magnesium (Mg), chromium (Cr), manganese (Mn), indium (In), cobalt (Co), nickel (Ni), copper (Cu), zinc (Zn), sodium (Na), lithium (Li), aluminum (Al), silicone (Si), silver (Ag), tin (Sn), and titanium (Ti).

Further, the blocking agent may be made of porphyrin-vanadium.

Further, a weight ratio of the blocking agent may be within a range of 1% to 10% of an overall weight of the phosphor and the blocking agent.

In addition, the encapsulation layer may include: a first phosphor having an emission peak wavelength of 500 to 560 nm; and a third phosphor having an emission peak wavelength of 621 to 670 nm.

In addition, the encapsulation layer may include a second phosphor having an emission peak wavelength of 561 to 620 nm.

In addition, the encapsulation layer may include a third phosphor having an emission peak wavelength of 621 to 670 nm.

In addition, the encapsulation layer may include: a second phosphor having an emission peak wavelength of 561 to 620 nm; and a third phosphor having an emission peak wavelength of 621 to 670 nm.

In addition, the white-light illumination apparatus may emit white light within a range of a correlated color temperature (CCT) of 2,700 K to 7,000 K.

In addition, the blue light-emitting diode element may have an emission peak wavelength of 470 nm to 490 nm, and one or two or more of a first phosphor having an emission peak wavelength of 500 to 560 nm, a second phosphor having an emission peak wavelength of 561 to 620 nm, and a third phosphor having an emission peak wavelength of 621 to 670 nm are distributed in the encapsulation layer without the blocking agent, such that the white light emission is implemented while blocking the light having the wavelength of 450 nm or less.

In addition, the white-light illumination apparatus may further include: a board mounted with the white light source; a light transmitting member embedded with the board and configured to transmit light emitted from the white light source; and a connecting member electrically connected to the board and configured to supply power for operating the white light source, in which the white-light illumination apparatus is implemented in the form of a fluorescent lamp or a flat plate.

A white light source for limiting wavelength of 450 nm or less according to another exemplary embodiment of the present invention includes: a blue light-emitting diode element having an emission peak wavelength of 450 nm to 490 nm; and an encapsulation layer configured to encapsulate the blue light-emitting diode element, in which one or more phosphors, which implement white light emission together with the blue light-emitting diode element, and a blocking agent, which blocks light of wavelength of 450 nm or less, are distributed in the encapsulation layer to limit the wavelength of 450 nm or less while forming a first peak region at a wavelength of 450 nm to 490 nm and a second peak region combined with the first peak region to implement the white light emission.

In this case, the blocking agent may include a chemical material selected from a porphyrin-based material, a phthalocyanine-based mount, and a coumarin-based material that comprise carbon (C), hydrogen (H), and nitrogen (N) as basic elements.

In addition, the blocking agent may include a metallic material together with the chemical material.

In this case, the metallic material may include one or two of vanadium (V), magnesium (Mg), chromium (Cr), manganese (Mn), indium (In), cobalt (Co), nickel (Ni), copper (Cu), zinc (Zn), sodium (Na), lithium (Li), aluminum (Al), silicone (Si), silver (Ag), tin (Sn), and titanium (Ti).

Further, the blocking agent may be made of porphyrin-vanadium.

Further, a weight ratio of the blocking agent may be within a range of 1% to 10% of an overall weight of the phosphor and the blocking agent.

In addition, the encapsulation layer may include: a first phosphor having an emission peak wavelength of 500 to 560 nm; and a third phosphor having an emission peak wavelength of 621 to 670 nm.

In addition, the encapsulation layer may include a second phosphor having an emission peak wavelength of 561 to 620 nm.

In addition, the encapsulation layer may include a third phosphor having an emission peak wavelength of 621 to 670 nm.

In addition, the encapsulation layer may include: a second phosphor having an emission peak wavelength of 561 to 620 nm; and a third phosphor having an emission peak wavelength of 621 to 670 nm.

In addition, the white-light illumination apparatus may emit white light within a range of a correlated color temperature (CCT) of 2,700 K to 7,000 K.

In addition, the blue light-emitting diode element may have an emission peak wavelength of 470 nm to 490 nm, and one or two or more of a first phosphor having an emission peak wavelength of 500 to 560 nm, a second phosphor having an emission peak wavelength of 561 to 620 nm, and a third phosphor having an emission peak wavelength of 621 to 670 nm are distributed in the encapsulation layer without the blocking agent, such that the white light emission is implemented while blocking the light having the wavelength of 450 nm or less.

Advantageous Effects

In the white light source and the illumination apparatus for limiting wavelength of 450 nm or less according to the exemplary embodiment of the present invention, white light can be implemented while limiting light wavelength of 450 nm or less, and the lithography or other process may be performed in the white lighting environment, and as a result, it is possible not only to prevent the problems of an increase in fatigue of operators, a deterioration in workability and efficiency, and a deterioration in visibility when the operator is exposed to the yellow lighting over a long period of time, but also to prevent an increase in manufacturing costs that may be incurred due to the additional process of mounting the wavelength shielding film or the like.

BRIEF DESCRIPTION OF THE DRAWINGS

The accompanying drawings included as a part of the detailed description for helping to understand the present invention provide exemplary embodiments of the present invention, and the technical spirit of the present invention will be described together with the detailed description.

FIG. 9 is a view illustrating experimental values of characteristics for each configuration of the white-light illumination apparatus for limiting wavelength of 450 nm or less according to the exemplary embodiment of the present invention.

DETAILED DESCRIPTION

Best Mode

The present invention may be variously modified and may have various exemplary embodiments, and specific exemplary embodiments will be described in detail below with reference to the accompanying drawings.

The following exemplary embodiments are provided to assist in comprehensive understanding of a method, an apparatus, and/or a system disclosed in the present specification. However, the exemplary embodiments are provided only for illustrative purpose, and the present invention is not limited thereto.

In addition, in the description of the exemplary embodiments of the present invention, the specific descriptions of publicly known technologies related with the present invention will be omitted when it is determined that the specific descriptions may unnecessarily obscure the subject matter of the present invention. In addition, the terms used herein are defined considering the functions in the present invention and may vary depending on the intention or usual practice of a user or an operator. Therefore, the definition of the present invention should be made based on the entire contents of the present specification. The terms used in the detailed description are provided only for describing the exemplary embodiments of the present invention and should not be restrictive. Unless explicitly used otherwise, singular expressions include plural expressions thereof. In the present specification, the terms "comprises," "comprising," "includes," "including," "containing," "has," "having" or other variations thereof are provided to indicate specific characteristics, numbers, steps, operations, elements, and some or combinations thereof, and it should not be construed to exclude the presence or possibility of one or more other characteristics, numbers, steps, operations, elements, and some or combinations thereof other than those disclosed.

In addition, the terms such as "first" and "second" may be used to describe various constituent elements, but the constituent elements should not be limited by the terms, and these terms are used only to distinguish one constituent element from another constituent element.

Hereinafter, exemplary embodiments of a white light source and an illumination apparatus for limiting wavelength of 450 nm or less according to the present invention will be described in detail with reference to the accompanying drawings.

Figure 1A:
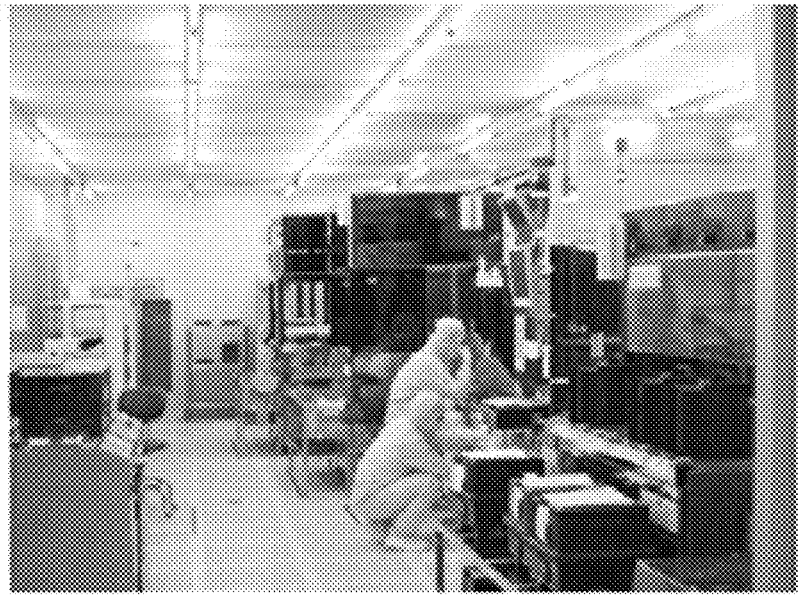
FIGS. 1A and 1B are views illustrating a lighting environment in an exposure room in the related art and a lighting environment in an exposure room according to the present invention.
Figure 1B:
Figure 2:
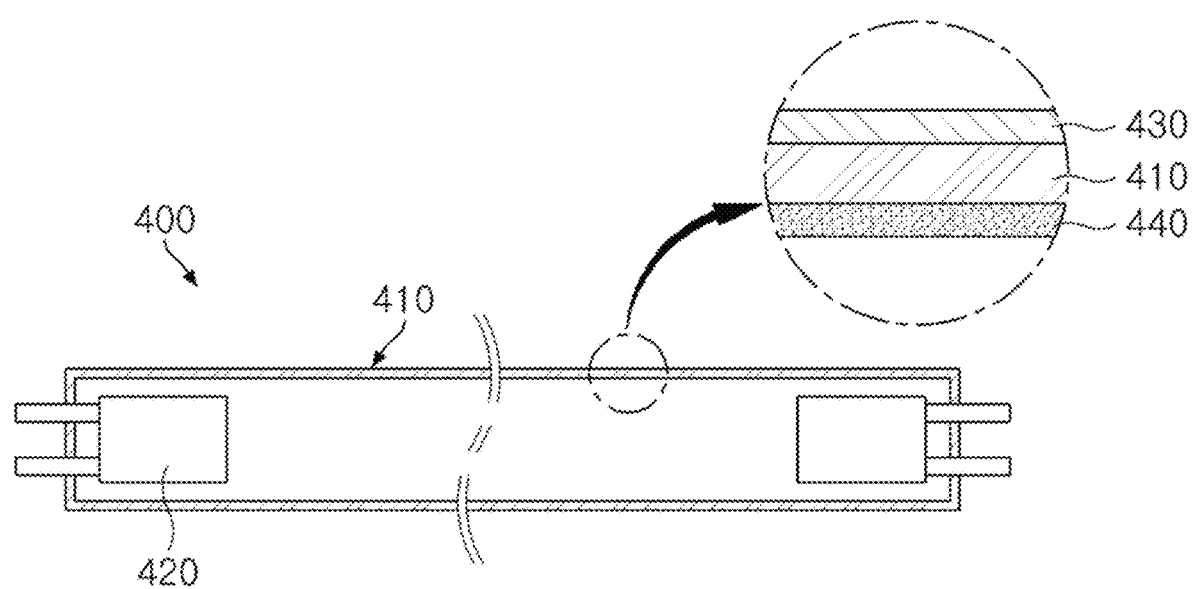
FIG. 2 is a view illustrating a lighting for an exposure room in the related art.
Figure 3:
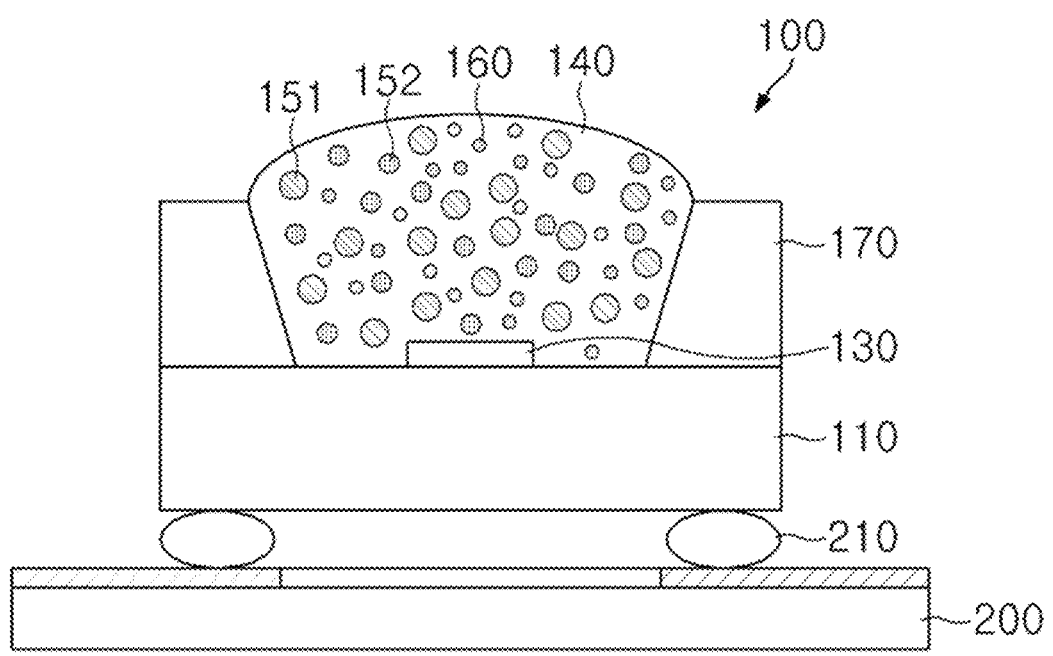
FIG. 3 is a cross-sectional view of a white light source for limiting wavelength of 450 nm or less according to an exemplary embodiment of the present invention.

First, FIG. 3 illustrates a cross-sectional view of a white light source 100 for limiting wavelength of 450 nm or less according to an exemplary embodiment of the present invention.

As can be seen from FIG. 3, the white light source 100 for limiting wavelength of 450 nm or less according to the exemplary embodiment of the present invention is the white light source 100 for limiting 450 nm or less, and the white light source 100 may include a blue light-emitting diode element 130 having an emission peak wavelength of 450 nm to 490 nm, and an encapsulation layer 140 configured to encapsulate the blue light-emitting diode element 130. In this case, one or more phosphors 150, which implement white light emission together with the blue light-emitting diode element 130, and a blocking agent 160, which blocks light of wavelength of 450 nm or less, are distributed in the encapsulation layer 140 to limit the wavelength of 450 nm or less while forming a first peak region at a wavelength of 450 nm to 490 nm and a second peak region combined with the first peak region to implement the white light emission. As a result, it is possible to provide the white light source 100 and an illumination apparatus 10 that may be used even in the exposure room or other places in which the lithography or other process is performed.

Figure 4:
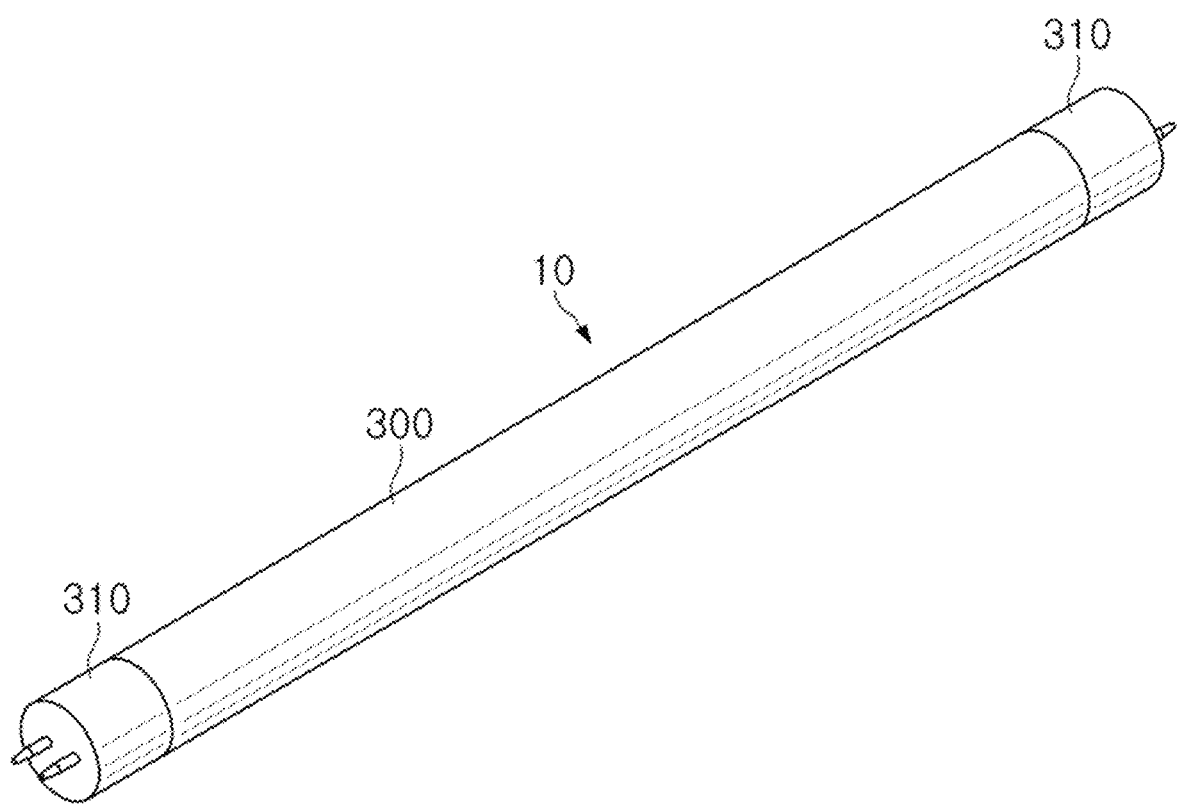
FIG. 4 is a perspective view of a white-light illumination apparatus for limiting wavelength of 450 nm or less according to the exemplary embodiment of the present invention.
Figure 5:
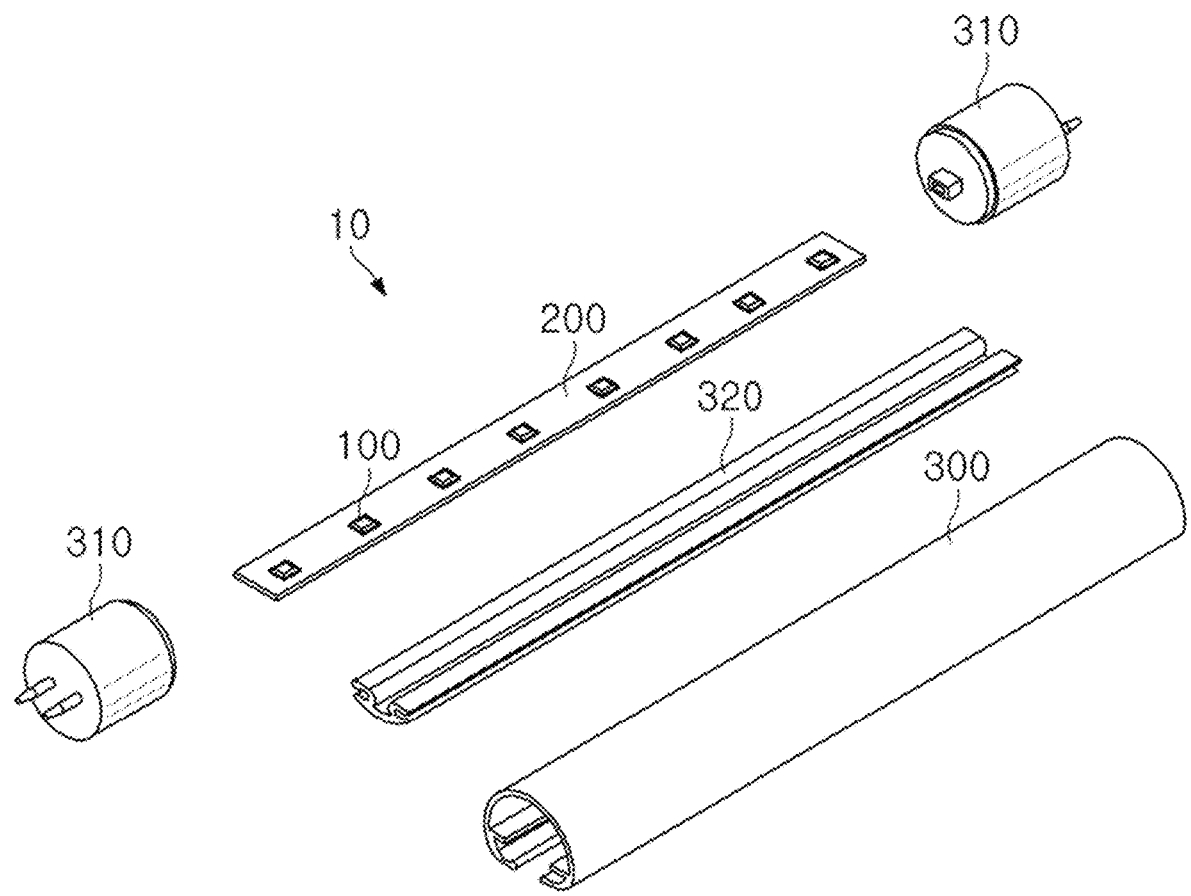
FIG. 5 is an exploded view of the white-light illumination apparatus for limiting wavelength of 450 nm or less according to the exemplary embodiment of the present invention.

In addition, FIG. 4 illustrates a perspective view of the white-light illumination apparatus 10 for limiting wavelength of 450 nm or less according to the exemplary embodiment of the present invention, and FIG. 5 illustrates an exploded view of the white-light illumination apparatus 10 for limiting wavelength of 450 nm or less according to the exemplary embodiment of the present invention.

As can be seen from FIGS. 4 and 5, the white-light illumination apparatus 10 for limiting wavelength of 450 nm or less according to the exemplary embodiment of the present invention may include a board 200 mounted with the white light sources 100, a light transmitting member 300 embedded with the board 200 and configured to transmit light emitted from the white light sources 100, and connecting members 310 electrically connected to the board 200 and configured to supply power for operating the white light sources 100, and the white-light illumination apparatus 10 may be configured in the form of a fluorescent lamp or a flat plate. However, the present invention is not necessarily limited thereto, the present invention may be implemented in various shapes limiting wavelength of 450 nm or less so as to be able to be used in the exposure room in which the lithography or other process is performed.

Hereinafter, each configuration of the white light source 100 and the illumination apparatus 10 for limiting wavelength of 450 nm or less according to the exemplary embodiment of the present invention will be described in more detail with reference to FIGS. 3 to 5.

First, FIG. 3 illustrates a cross-sectional view of the white light source 100 for limiting wavelength of 450 nm or less according to the exemplary embodiment of the present invention.

As can be seen from FIG. 3, the white light source 100 for limiting wavelength of 450 nm or less according to the exemplary embodiment of the present invention includes the light-emitting diode element 130 such as an LED chip mounted on a base board 110. Therefore, the white light source 100 for limiting wavelength of 450 nm or less may be joined by ball grids 210 by a surface mount technology (SMT) and mounted on various types of boards 200 such as a metal board (metal PCB). Of course, the package structure illustrated in FIG. 3 is an example as one exemplary embodiment of the present invention, and the package structure may also be implemented by other packaging methods.

A frame 170 having a predetermined shape, for example, a conical shape is installed on the base board 110 of the white light source 100 for limiting wavelength of 450 nm or less, and a reflector may be provided on an inner surface of the frame 170 to efficiently reflect the light emitted from the light-emitting diode element 130. In addition, although not illustrated, an electrode of the light-emitting diode element 130 may be electrically connected to a metal wire on the base board 110 by means of a bonding wire or the like.

In addition, the encapsulation layer 140 includes the one or more phosphors 150 that may emit light by being excited at an excitation wavelength of the blue light-emitting diode element 130, such that the encapsulation layer 140 may implement white light emission together with the blue light-emitting diode element 130. In particular, the blocking agent 160 for blocking the light with the wavelength used in the lithography or other process is distributed, together with the phosphors 150, in the encapsulation layer 140.

Further, a weight ratio of the blocking agent 160 in the encapsulation layer 140 may be within a range of 1% to 10% of an overall weight of the phosphor 150 and the blocking agent 160.

In this case, a first phosphor 151 having an emission peak wavelength of 500 to 560 nm and a third phosphor 153 having an emission peak wavelength of 621 to 670 nm may be distributed, together with the blocking agent 160, in the encapsulation layer 140.

In addition, a second phosphor having an emission peak wavelength of 561 to 620 nm may be included and distributed, together with the blocking agent 160, in the encapsulation layer 140.

In addition, the third phosphor having the emission peak wavelength of 621 to 670 nm may be included and distributed, together with the blocking agent 160, in the encapsulation layer 140.

In addition, the second phosphor having the emission peak wavelength of 561 to 620 nm and the third phosphor having the emission peak wavelength of 621 to 670 nm may be included and distributed, together with the blocking agent 160, in the encapsulation layer 140.

More specifically, in the present invention, the phosphor 150, such as the first to third phosphors 151, 152, and 153, may be provided in the form of powder. Therefore, the encapsulation layer 140 may include transparent resin which seals the light-emitting diode element 130 while distributing and fixing the phosphor 150.

In the present invention, typical silicone or epoxy resin may be used as the transparent resin.

In the present invention, the one or more phosphors 150 are provided to implement the white light emission together with the blue light-emitting diode element 130.

In this case, blue light, green light, and red light need to be appropriately combined to implement the white light emission. In the present invention, it is preferred that the wavelength to be used does not exceed a wavelength region 450 nm or less used in the lithography or other process, such that the blue light-emitting diode element 130 is restricted as having an emission peak wavelength of 450 nm to 490 nm.

Figure 6:
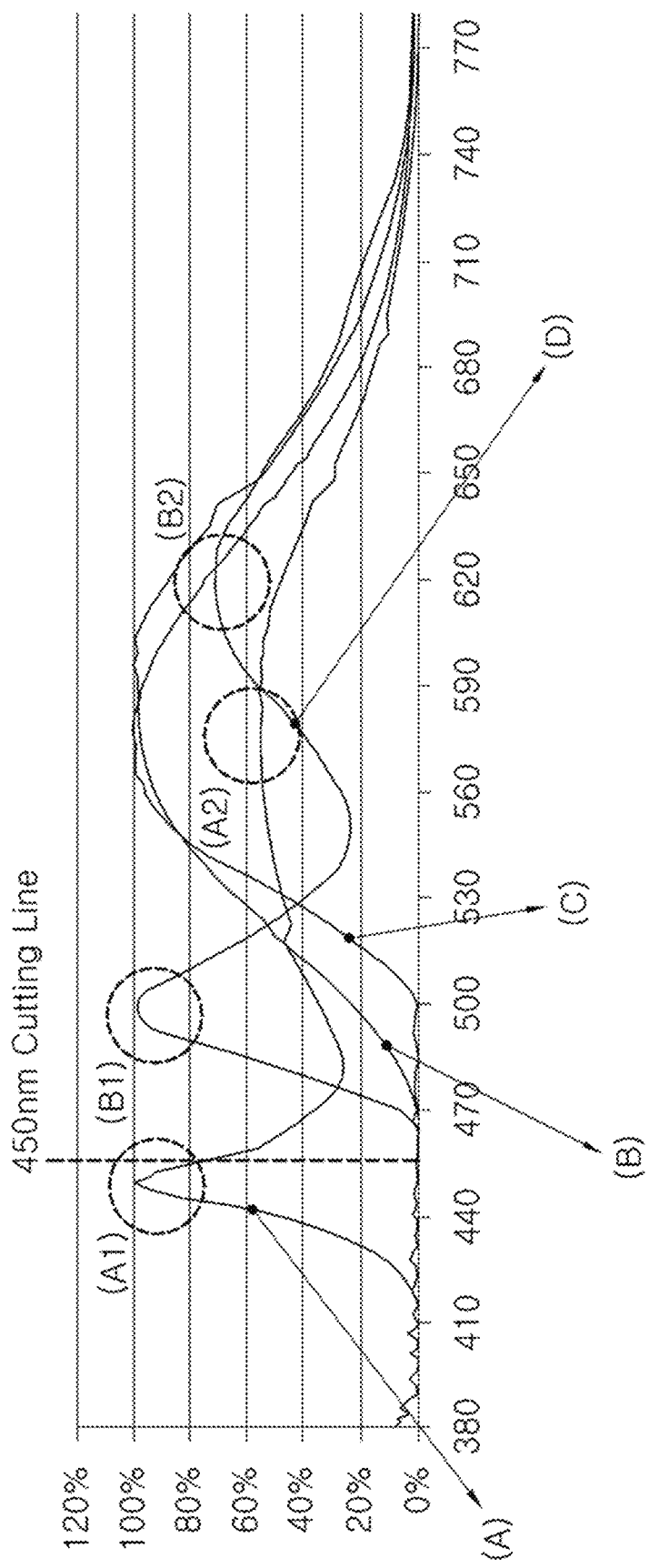
FIG. 6 is a graph illustrating spectra of the white-light illumination apparatus for limiting wavelength of 450 nm or less according to the exemplary embodiment of the present invention.

That is, as can be seen from FIG. 6, in the related art, in order to implement a white light emission element by using a light-emitting diode (A in FIG. 6), a first peak region is formed (A1 in FIG. 6) at a blue wavelength by using a blue light-emitting diode element having a wavelength of 450 nm or less, and a second peak region is formed at a yellow wavelength by using a yellow phosphor or the like (A2 in FIG. 6), thereby implementing the white light emission. In contrast, in the present invention, the emission peak wavelength of 450 nm to 490 nm may be implemented in consideration of the wavelength region 450 nm or less used in the lithography or other process.

Therefore, the white light source 100 and the illumination apparatus 10 for limiting wavelength of 450 nm or less according to the exemplary embodiment of the present invention (B in FIG. 6) are characterized by forming the first peak region (B1 in FIG. 6) at a wavelength of 450 nm to 490 nm by using the blue light-emitting diode element 130 having the emission peak wavelength of 450 nm to 490 nm, and forming the second peak region (B2 in FIG. 6) for implementing the white light emission in combination with the first peak wavelength by using the one or more phosphors 150, thereby implementing the white light emission in combination with the first peak region while emitting light.

Therefore, in the present invention, the one or more phosphors 150 may be selected and limited to the phosphor 150 that may implement the white light emission in combination with the first peak region at the wavelength of 450 nm to 490 nm made by the blue light-emitting diode element 130.

Furthermore, in the present invention, the one or more phosphors 150 may be made of one or more fluorescent materials having different compositions.

More specifically, in the present invention, the first phosphor 151 may be excited by the light emitted from the light-emitting diode element 130 to emit light having a peak wavelength within a range of 500 to 560 nm. The emission peak wavelength of the first phosphor 151 is larger than a peak wavelength of the light emitted from the light-emitting diode element 130.

In the present invention, as the first phosphor 151, one of the phosphors represented by the following Chemical Formula 1 or 2 may be used, or a combination of the plurality of phosphors represented by the following Chemical Formula 1 or 2 may be used.

(Chemical Formula 1)

Further, $Al_5Lu_3O_{12}:Ce^{++}$ may be used as a Garnet-structured phosphor made based on Al and Lu.

(Chemical Formula 2)

Further, $Si^{6-Z}AlZOZN^{8-Z}:Eu^{++}$ (Z=0.1 to 0.3) may be used as an oxynitride-based phosphor made based on Si, O, and N.

In addition, in the present invention, the second phosphor 152 is excited by the light emitted from the light-emitting diode element 130 and emits light having a peak wavelength in a range of 561 to 620 nm, and phosphors, which are represented by the following Chemical Formulas 3 to 5, may be used alone or in combination as the second phosphor 152.

(Chemical Formula 3)

Further, $Y_3Al_5O_{12}:Ce^{+++}$ may be used as a Garnet structure phosphor made based on Y and Al.

(Chemical Formula 4)

Further, $Sr,Ba,Ca\ 2SiO_4:Eu^{++}$ may be used as a silicate-based phosphor made based on Sr, Ba, Ca, or Si.

(Chemical Formula 5)

Further, $CaSiAlON:Eu^{++}$ may be used as an oxynitride-based phosphor made based on Si, Al, O, and N.

In addition, in the present invention, the third phosphor 153 is excited by the light emitted from the light-emitting diode element 130 and emits light having a peak wavelength within a range of 621 to 670 nm, and phosphors, which are represented by the following Chemical Formula 6 or 7, may be used alone or in combination as the third phosphor 153.

(Chemical Formula 6)

Further, $CaAlSiN_3$:$Eu^{++}$ may be used as a nitride-based phosphor made based on Ca, Si, and N.

(Chemical Formula 7)

Further, Sr,Ca $AlSiN_3$:$Eu^{++}$ may be used as a nitride-based phosphor made based on Sr, Ca, Si, or N.

In particular, in the white light source 100 and the illumination apparatus 10 for limiting wavelength of 450 nm or less according to the exemplary embodiment of the present invention, the blocking agent 160 may be distributed together with the one or more phosphors 150 in the encapsulation layer 140 to implement the white light while blocking the light having the wavelength of 450 nm or less.

In this case, the blocking agent 160 may include a chemical material selected from a porphyrin-based material, a phthalocyanine-based material, and a coumarin-based material which includes carbon (C), hydrogen (H), and nitrogen (N) as basic elements.

In addition, the blocking agent 160 may include a metallic material together with the chemical material.

In this case, the metallic material may include one or two of vanadium (V), magnesium (Mg), chromium (Cr), manganese (Mn), indium (In), cobalt (Co), nickel (Ni), copper (Cu), zinc (Zn), sodium (Na), lithium (Li), aluminum (Al), silicone (Si), silver (Ag), tin (Sn), and titanium (Ti).

Mode for Invention

Figure 7A:
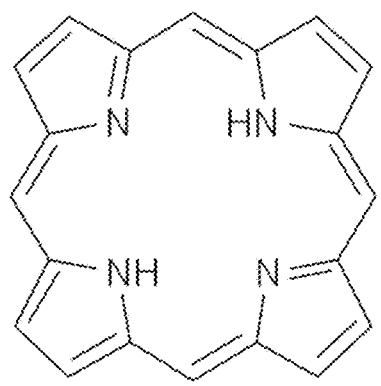
FIG. 7A is an exemplified view illustrating a molecular formula of one type of blocking agent made of porphyrin-vanadium used for the white light source for limiting wavelength of 450 nm or less according to the exemplary embodiment of the present invention.
Figure 7B:
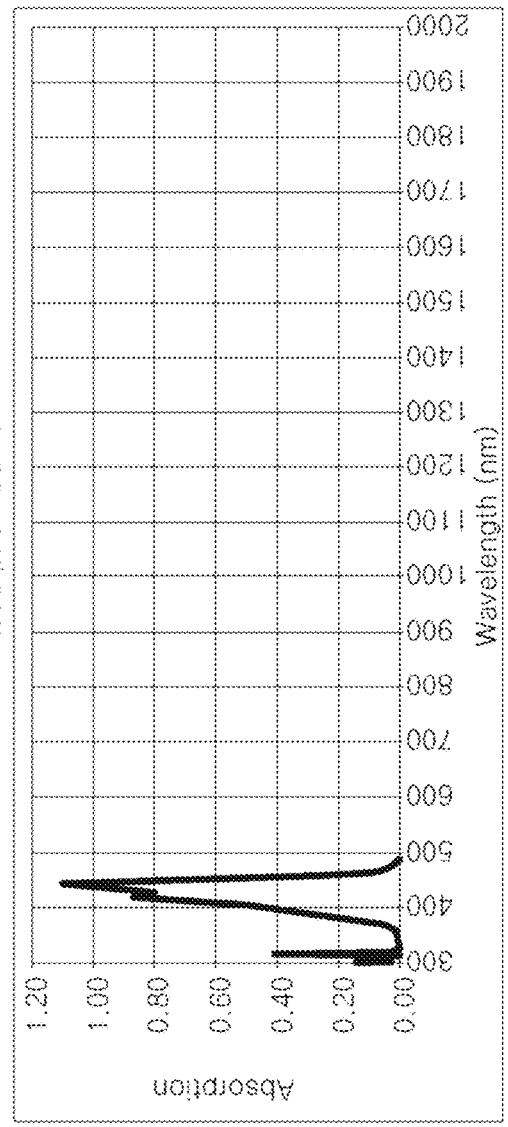
FIGS. 7B and 7C are graphs illustrating absorption and transmission for each wavelength.
Figure 7C:
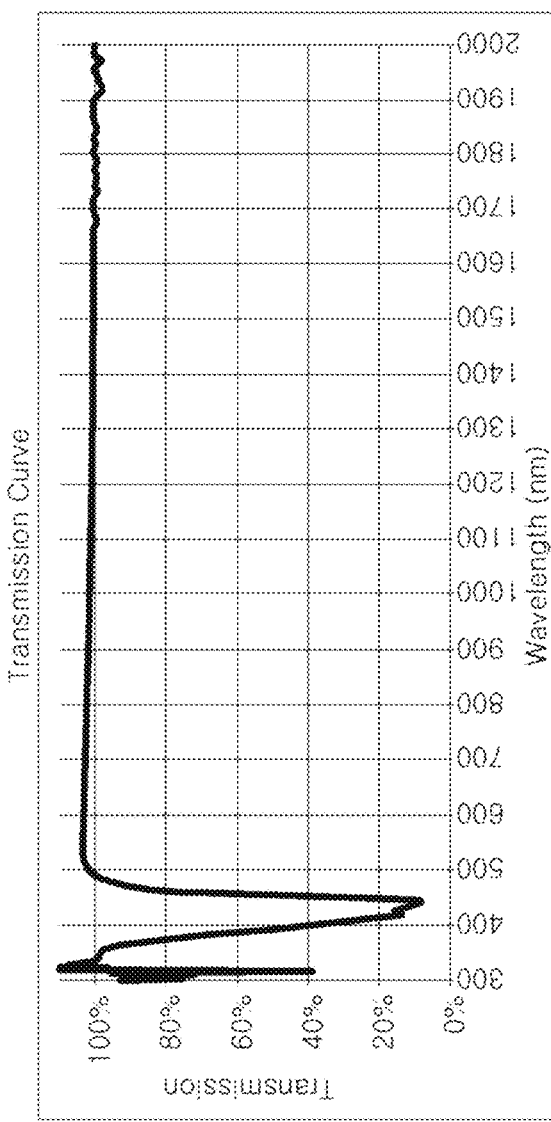

More specifically, FIG. 7A illustrates a molecular formula of one type of blocking agent made of porphyrin-vanadium used for the white light source 100 for limiting wavelength of 450 nm or less according to the exemplary embodiment of the present invention, and FIGS. 7B and 7C are graphs illustrating absorption and transmission for each wavelength.

In the present invention, one type of blocking agent 160 having a molecule structure represented by the following Chemical Formula 8 is provided and distributed in the encapsulation layer 140 together with the one or more phosphors 150.

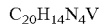             (Chemical Formula 8)

$C_{20}H_{14}N_4V$

In this case, as can be seen from FIGS. 7B and 7C, it can be ascertained that one type of blocking agent 160 made of porphyrin-vanadium absorbs the light having the wavelength of 450 nm or less while effectively transmitting the light having a wavelength of more than 450 nm.

In particular, a weight ratio of the one type of blocking agent 160 made of porphyrin-vanadium may be within a range of 1% to 10% of an overall weight of the phosphor 150 and the blocking agent 160.

The inventors of the present invention have ascertained that it is possible to implement white lighting instead of yellow lighting while blocking the light having the wavelength of 450 nm or less with the configuration in which the one type of blocking agent 160 made of porphyrin-vanadium is distributed in the encapsulation layer 140 together with the one or more phosphors 150 and the weight ratio of the blocking agent 160 is within the range of 1% to 10% of the overall weight of the phosphor 150 and the blocking agent 160.

In this case, the white-light illumination apparatus 10 for limiting wavelength of 450 nm or less according to the exemplary embodiment of the present invention may emit white light within a range of a correlated color temperature (CCT) of 2,700 K to 7,000 K.

Further, the board 200 may be provided with a pad mounted with the white light source 100 for limiting wavelength of 450 nm or less, and a circuit pattern for operating the white light source 100 for limiting wavelength of 450 nm or less. The board 200 may be made of a dielectric material such as FR-4. Further, the board 200 may be made of various materials such as a metal board (metal PCB) in order to facilitate the dissipation of heat from the white light source 100. In this case, the board 200 may be electrically connected to the connecting member 310 and supplied with external power.

Further, the white-light illumination apparatus 10 for limiting wavelength of 450 nm or less according to the exemplary embodiment of the present invention may be provided with a heat dissipation member 320 configured to dissipate heat generated from the white light source 100 for limiting wavelength of 450 nm or less and configured such that the board 200 is seated on the heat dissipation member 320. Therefore, in order to facilitate the dissipation of heat, the heat dissipation member 320 connected to the board 200 may be made of a metallic material or implemented to have a structure advantageous to the dissipation of heat.

In addition, the white-light illumination apparatus 10 for limiting wavelength of 450 nm or less according to the exemplary embodiment of the present invention may be embedded with the white light source 100 for limiting wavelength of 450 nm or less and provided with the light transmitting member 300 configured to transmit the light emitted from the white light source 100 for limiting wavelength of 450 nm or less. The light transmitting member 300 may be made of PC, PMMA, glass, or the like that may effectively transmit the light emitted from the white light source 100 for limiting wavelength of 450 nm or less. Further, the light transmitting member 300 may be made of a semi-transparent material in order to reduce light blindness.

Figure 8:
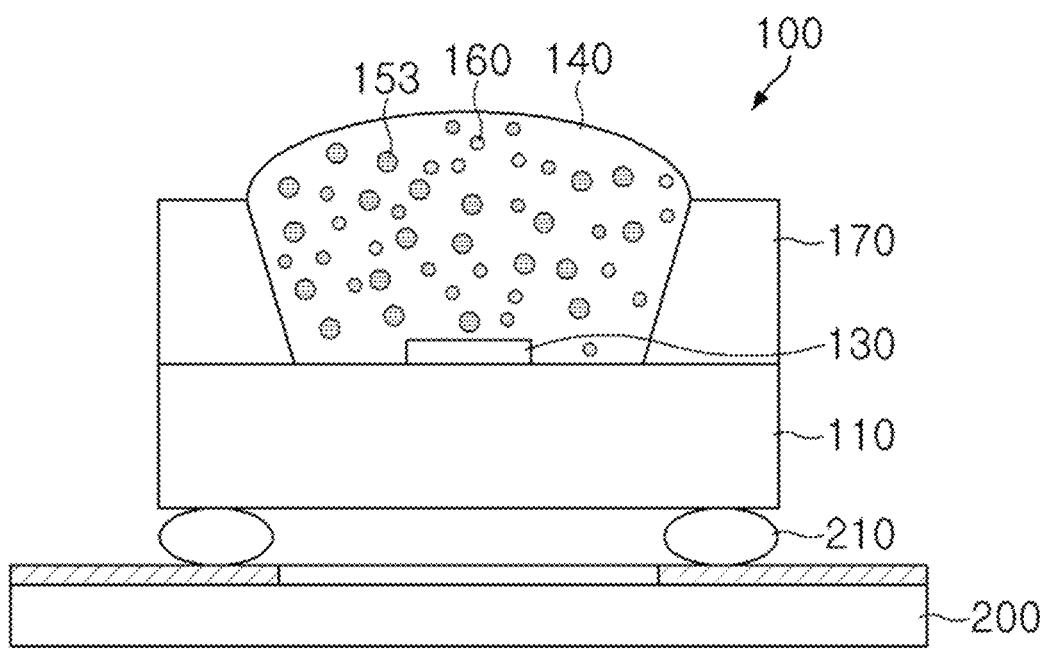
FIG. 8 is a cross-sectional view of the white light source for limiting wavelength of 450 nm or less according to the exemplary embodiment of the present invention.

In addition, as can be seen from FIG. 8, the white-light illumination apparatus 10 for limiting wavelength of 450 nm or less according to the exemplary embodiment of the present invention may include the blue light-emitting diode element 130 having the emission peak wavelength of 470 nm to 490 nm, and the encapsulation layer 140 configured to encapsulate the blue light-emitting diode element 130. In this case, one or two or more of the first phosphor 151 having the emission peak wavelength of 500 to 560 nm, the second phosphor 152 having the emission peak wavelength of 561 to 620 nm, and the third phosphor 153 having the emission peak wavelength of 621 to 670 nm are included, without the blocking agent 160, in the encapsulation layer 140 and distributed together with the blocking agent 160, such that the white light emission may be implemented while blocking the light having the wavelength of 450 nm or less.

In addition, FIG. 9 is a view illustrating experimental values of characteristics for each configuration of the white-light illumination apparatus 10 for limiting wavelength of 450 nm or less according to the exemplary embodiment of the present invention, and FIGS. 10A to 10G are views illustrating light emitting spectra of the white-light illumination apparatus 10 for limiting wavelength of 450 nm or less in accordance with the experimental values of characteristics for each configuration illustrated in FIG. 8.

Hereinafter, the present invention will be described in more detail with reference to FIGS. 9 and 10A to 10G based on experimental values of the white-light illumination apparatus 10 for limiting wavelength of 450 nm or less according to the exemplary embodiment of the present invention.

First, FIG. 9 illustrates experimental values of performance when compositions of the phosphor 150 and the blocking agent 160 are changed while changing wavelengths of the blue light-emitting diode element 130 in the white-light illumination apparatus 10 for limiting wavelength of 450 nm or less according to the exemplary embodiment of the present invention.

More specifically, (1) to (7) in FIG. 9 illustrate wavelengths of the blue light-emitting diode element 130, sizes of spectra, and blocking ratios at the wavelength of 450 nm, which are measured by combining the compositions of the first to third phosphors 151, 152, and 153 in accordance with whether the blocking agent 160 is added.

First, (1) in FIG. 8 illustrates values measured when the first phosphor 151 and the third phosphor 153 are used by being combined with the blue light-emitting diode element 130 having the peak wavelength of 450 to 460 nm. In this case, a weight ratio of the first phosphor 151 was 81%, a weight ratio of the third phosphor 153 was 15%, and a weight ratio of the blocking agent 160 was 4%.

In addition, the encapsulation layer 140 was configured such that a weight ratio of the silicone was 92.4%, and a weight ratio of the phosphor 150 and the blocking agent 160 was 7.6%.

Figure 10A:
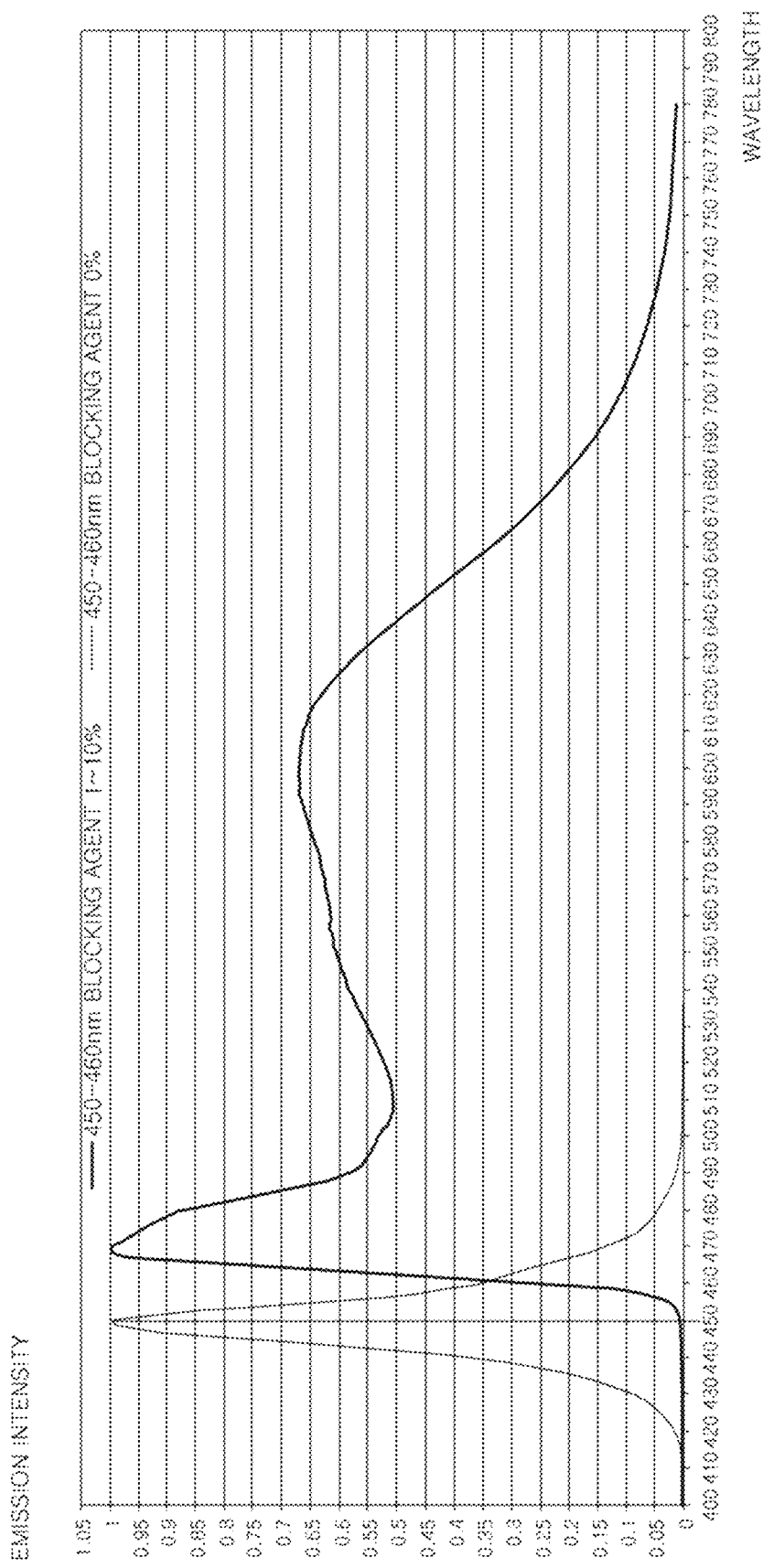
FIGS. 10A to 10G are views illustrating light emitting spectra of the white-light illumination apparatus for limiting wavelength of 450 nm or less according to the exemplary embodiment of the present invention.

Therefore, as can be seen from FIG. 10A, in the white-light illumination apparatus 10 for limiting wavelength of 450 nm or less which is configured with the above-mentioned composition, the light having a wavelength of 450 nm is attenuated only by 0.87% in comparison with a maximum value when the blocking agent 160 is not used. In contrast, when the blocking agent 160 is used, the light having a wavelength of 450 nm may be blocked by up to 99.38%, such that it is possible to implement the white light emission while blocking the light having the wavelength of 450 nm or less.

In addition, (2) in FIG. 9 illustrates values measured when the first phosphor 151 and the third phosphor 153 are used by being combined with the blue light-emitting diode element 130 having the peak wavelength of 460 to 470 nm. In this case, the weight ratio of the first phosphor 151 was adjusted to 82.5%, the weight ratio of the third phosphor 153 was adjusted to 15%, and the weight ratio of the blocking agent 160 was adjusted to 2.5%.

In addition, the encapsulation layer 140 was configured such that the weight ratio of the silicone was 94.4%, and the weight ratio of the phosphor 150 and the blocking agent 160 was 5.6%.

Figure 10B:
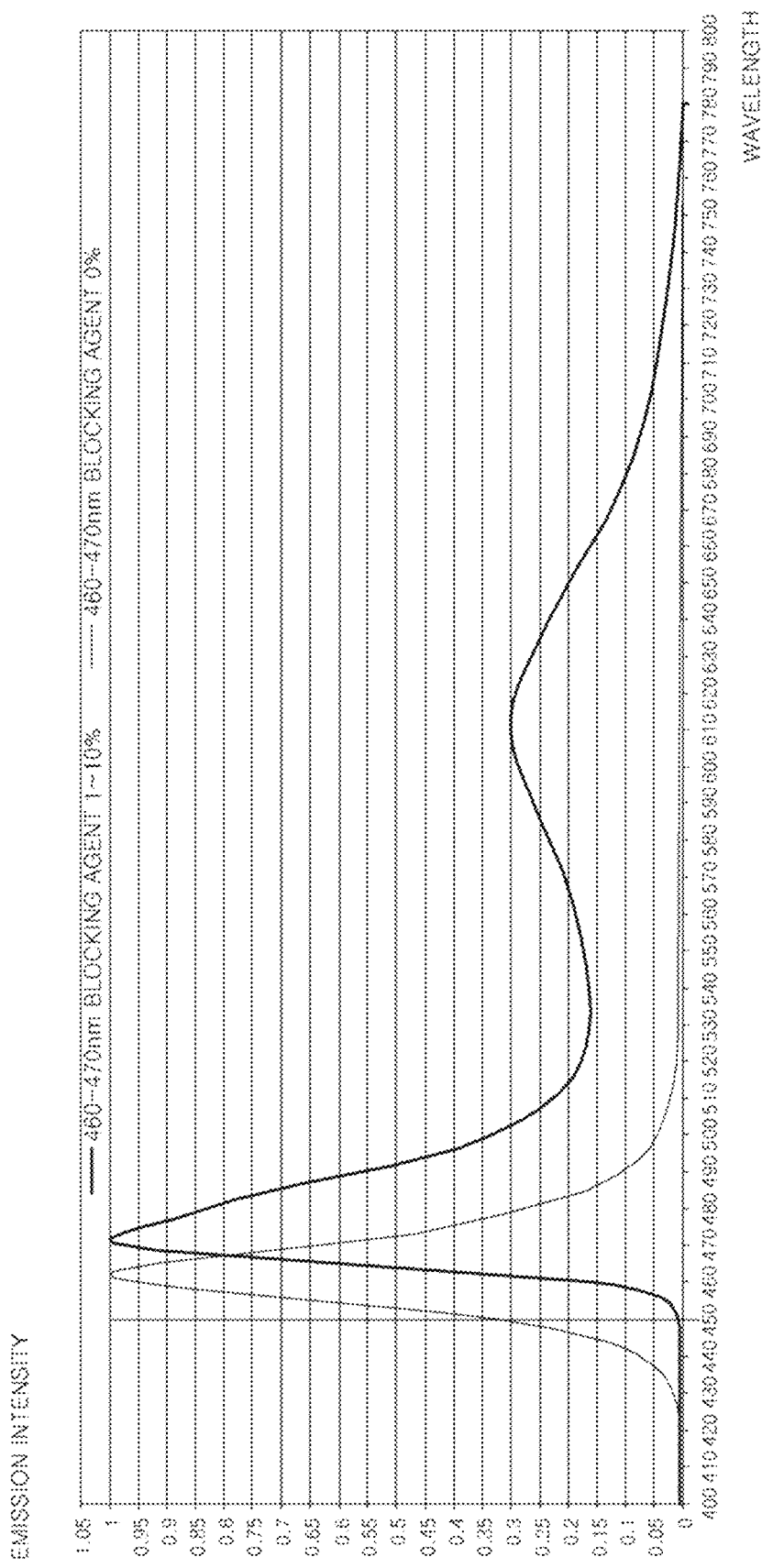

Therefore, as can be seen from FIG. 10B, in the white-light illumination apparatus 10 for limiting wavelength of 450 nm or less which is configured with the composition as described above, when the blocking agent 160 is not used, the light having the wavelength of 450 nm may be attenuated by up to 67.71% in comparison with the maximum value, but this configuration cannot yet sufficiently limit the light having the wavelength of 450 nm or less. In contrast, it can be seen that the case in which the blocking agent 160 is used may block the light having the wavelength of 450 nm by up to 99.48%.

In addition, (3) in FIG. 9 illustrates values measured when the first phosphor 151 and the third phosphor 153 are used by being combined with the blue light-emitting diode element 130 having a peak wavelength of 470 to 480 nm. In this case, the weight ratio of the first phosphor 151 was adjusted to 83.5%, the weight ratio of the third phosphor 153 was adjusted to 15%, and the weight ratio of the blocking agent 160 was adjusted to 1.5%.

In addition, the encapsulation layer 140 was configured such that the weight ratio of the silicone was 91.8%, and the weight ratio of the phosphor 150 and the blocking agent 160 was 8.2%.

Figure 10C:
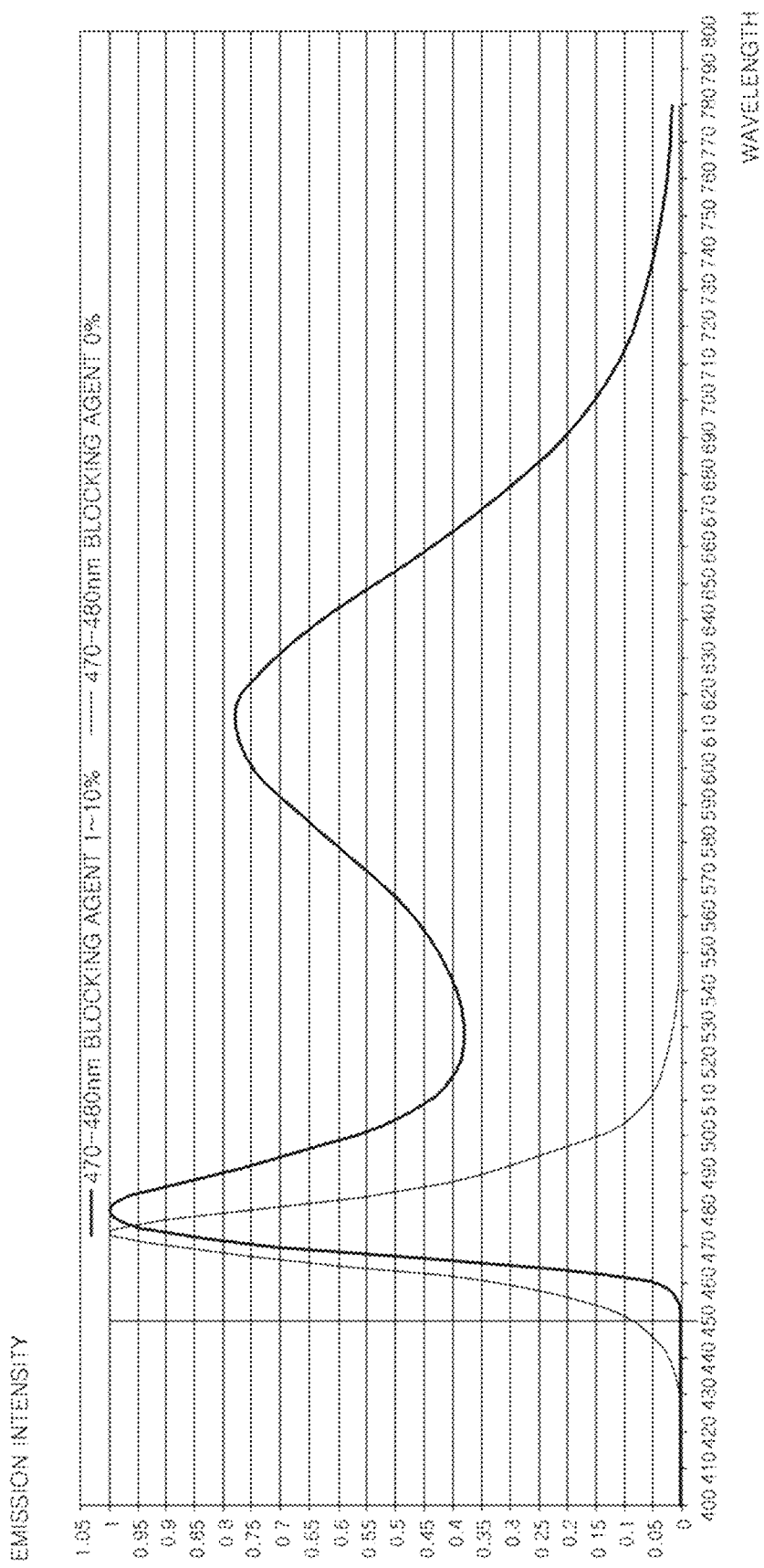

Therefore, as can be seen from FIG. 10C, in the white-light illumination apparatus 10 for limiting wavelength of 450 nm or less which is configured as described above, when the blocking agent 160 is not used, the light having the wavelength of 450 nm may be attenuated by up to 93.05% in comparison with the maximum value, but this configuration still cannot limit the light having the wavelength of 450 nm or less to a level at which the occurrence of error is sufficiently prevented. In contrast, it can be seen that the case in which the blocking agent 160 is used may block the light having the wavelength of 450 nm by up to 99.63%.

In addition, (4) in FIG. 9 illustrates values measured when the second phosphor 152 and the third phosphor 153 are combined with the blue light-emitting diode element 130 having the peak wavelength of 470 to 480 nm. In this case, the weight ratio of the second phosphor 152 was 95.9%, the weight ratio of the third phosphor 153 was 2.1%, and the weight ratio of the blocking agent 160 was 2.0%.

In addition, the encapsulation layer 140 was configured such that the weight ratio of the silicone was 95.6%, and the weight ratio of the phosphor 150 and the blocking agent 160 was 4.4%.

Figure 10D:
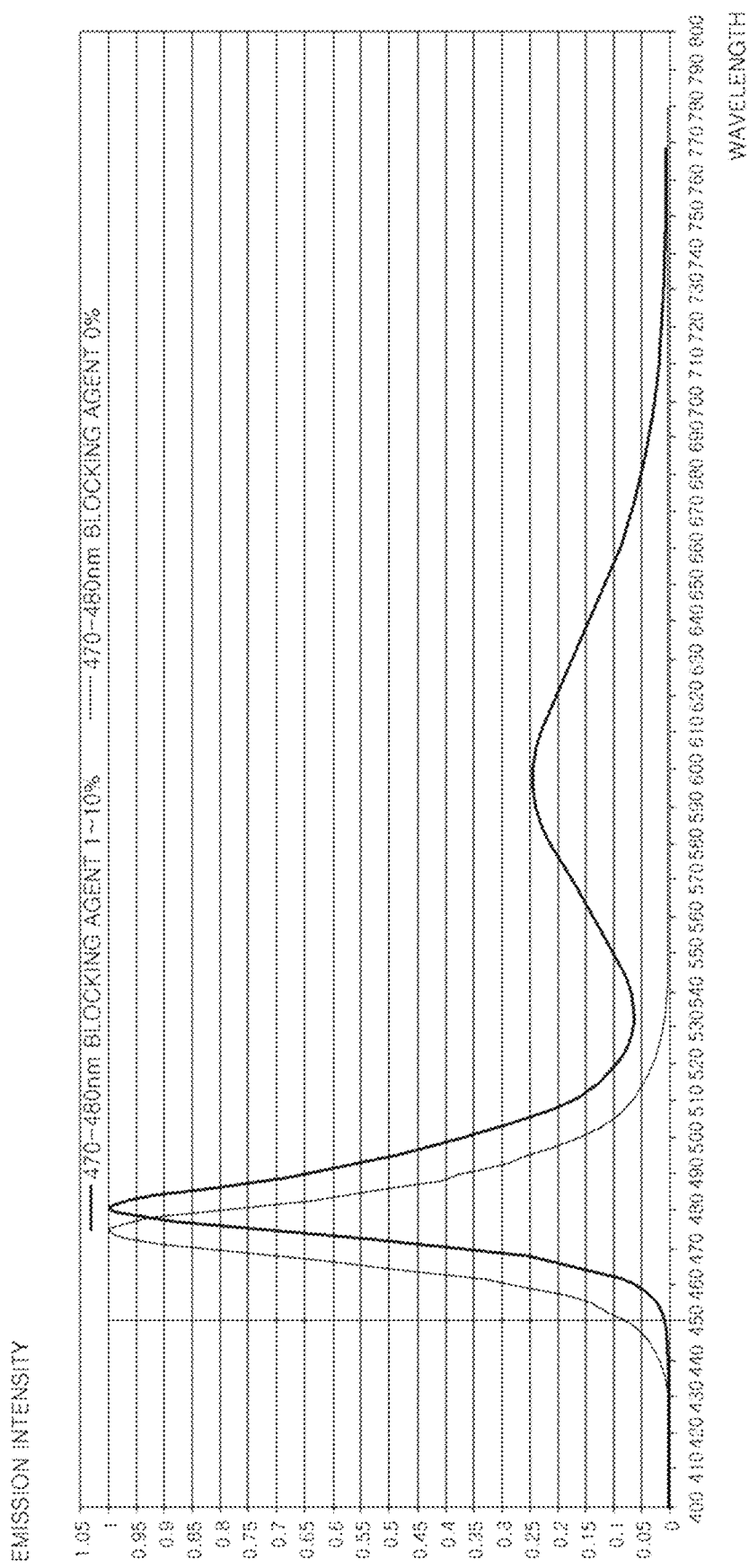

Therefore, as can be seen from FIG. 10D, in the white-light illumination apparatus 10 for limiting wavelength of 450 nm or less which is configured as described above, when the blocking agent 160 is not used, the light having the wavelength of 450 nm may be attenuated by up to 93.05% in comparison with the maximum value, but this configuration still cannot limit the light having the wavelength of 450 nm or less to a level at which the occurrence of error is sufficiently prevented. In contrast, it can be seen that the case in which the blocking agent 160 is used may block the light having the wavelength of 450 nm by up to 99.36%.

In addition, (5) in FIG. 9 illustrates values measured when the first phosphor 151 and the third phosphor 153 are used by being combined with the blue light-emitting diode element 130 having a peak wavelength of 470 to 480 nm. In this case, the weight ratio of the first phosphor 151 was 83.0%, the weight ratio of the third phosphor 153 was 15.0%, and the weight ratio of the blocking agent 160 was 1.5%.

In addition, the encapsulation layer 140 was configured such that the weight ratio of the silicone was 95.6%, and the weight ratio of the phosphor 150 and the blocking agent 160 was 4.4%.

Figure 10E:
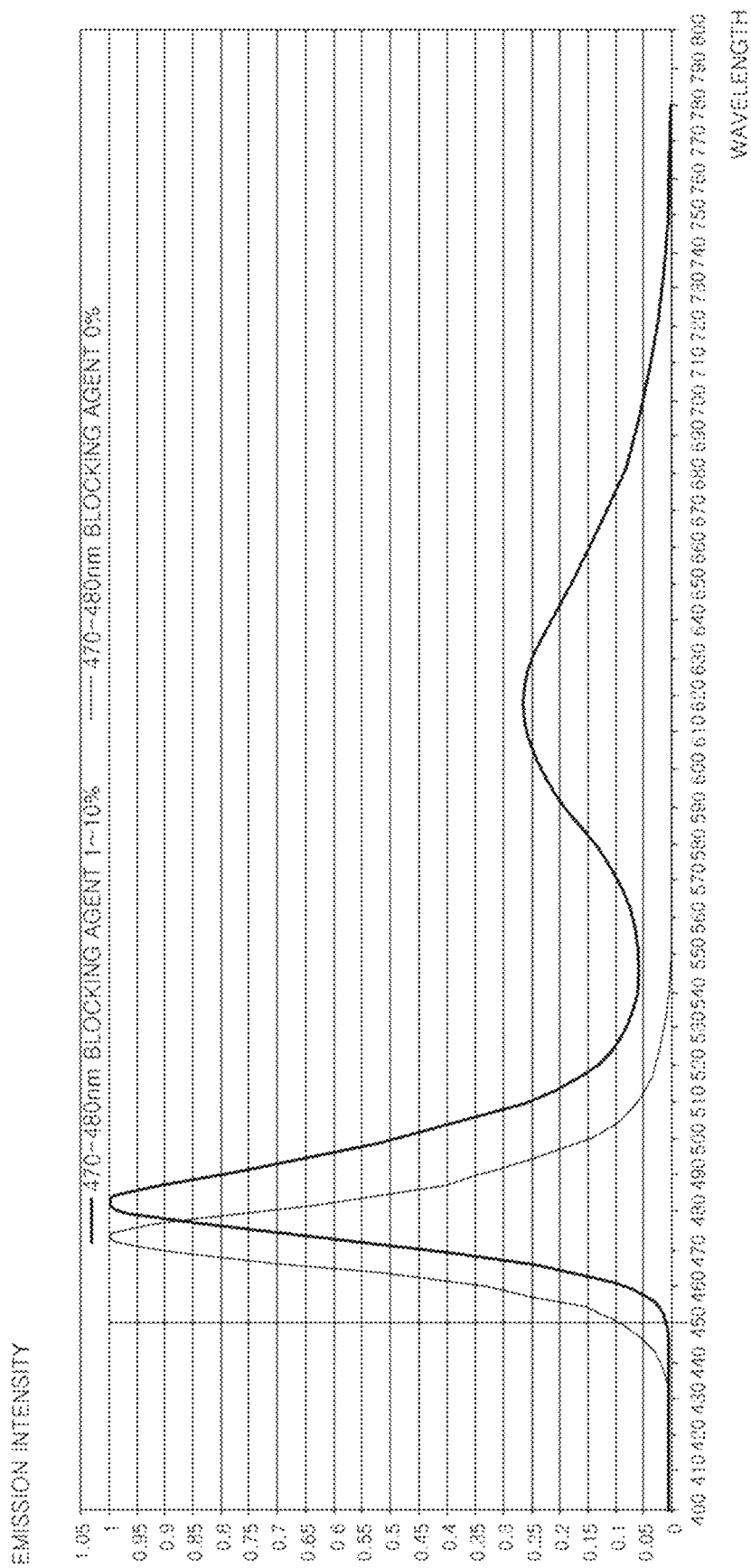

Therefore, as can be seen from FIG. 10E, in the white-light illumination apparatus 10 for limiting wavelength of 450 nm or less which is configured as described above, when the blocking agent 160 is not used, the light having the wavelength of 450 nm may be attenuated by up to 93.05% in comparison with the maximum value, but this configuration still cannot limit the light having the wavelength of 450 nm or less to a level at which the occurrence of error is sufficiently prevented. In contrast, it can be seen that the case in which the blocking agent 160 is used may block the light having the wavelength of 450 nm by up to 99.42%.

In addition, (6) in FIG. 9 illustrates values measured when the first phosphor 151 and the third phosphor 153 are used by being combined with the blue light-emitting diode element 130 having a peak wavelength of 480 to 490 nm. In this case, the weight ratio of the first phosphor 151 was 84.0%, the weight ratio of the third phosphor 153 was 15.0%, and the weight ratio of the blocking agent 160 was 1.0%.

In addition, the encapsulation layer 140 was configured such that the weight ratio of the silicone was 94.6%, and the weight ratio of the phosphor 150 and the blocking agent 160 was 5.4%.

Figure 10F:
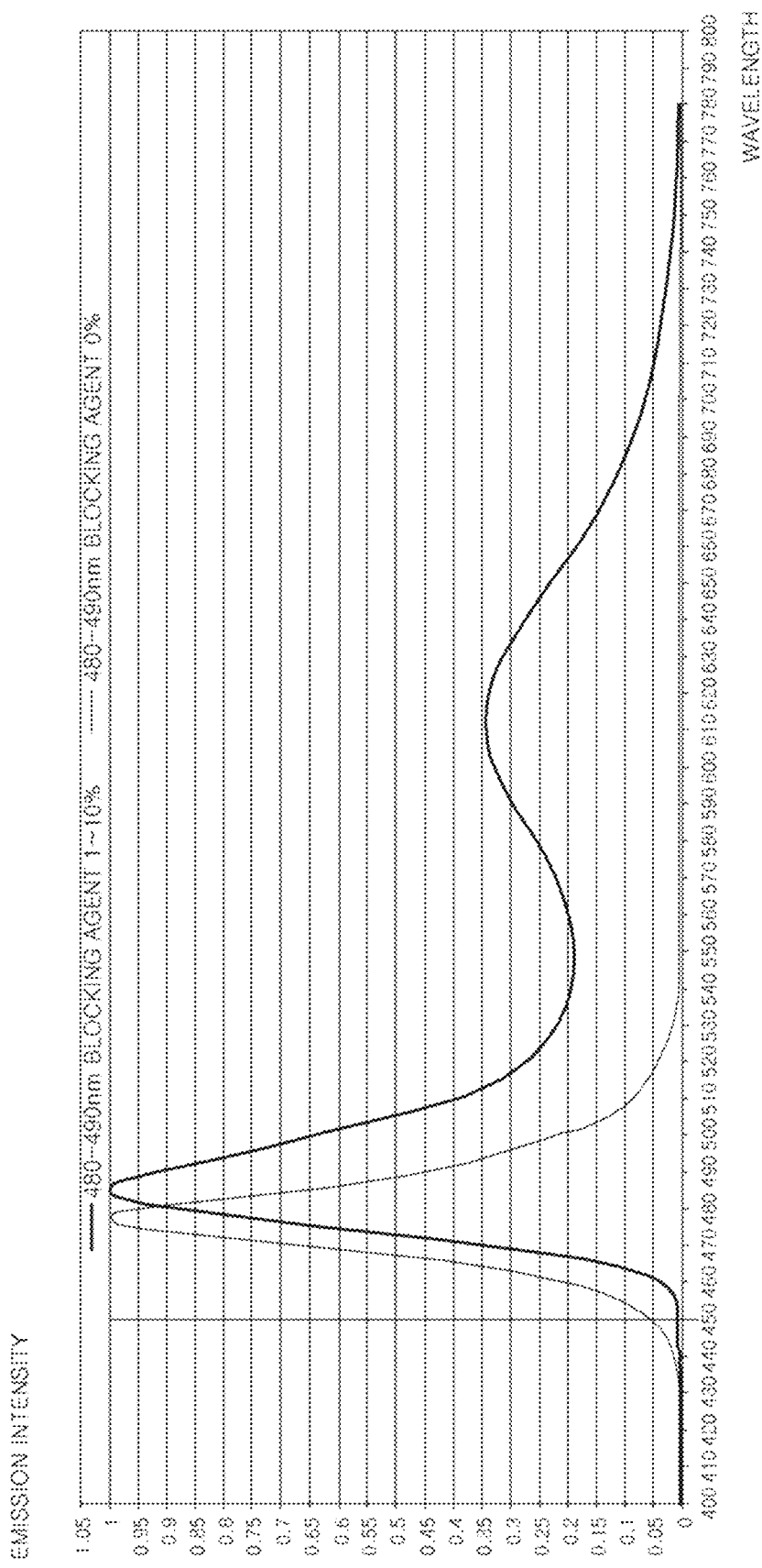

Therefore, as can be seen from FIG. 10F, in the white-light illumination apparatus 10 for limiting wavelength of 450 nm or less which is configured as described above, when the blocking agent 160 is not used, the light having the wavelength of 450 nm may be attenuated by up to 95.39% in comparison with the maximum value, and thus the light having the wavelength of 450 nm or less appears to significantly prevent the occurrence of error, but this configuration still cannot reach the level achieved when the blocking agent 160 is used. In contrast, it can be seen that the case in which the blocking agent 160 is used may block the light having the wavelength of 450 nm by up to 99.73%.

Lastly, (7) in FIG. 9 illustrates values measured when the first phosphor 151 and the second phosphor 152 are used by being combined with the blue light-emitting diode element 130 having a peak wavelength of 480 to 490 nm. In this case, the weight ratio of the first phosphor 151 was 3.0%, the weight ratio of the second phosphor 152 was 95.5%, and the weight ratio of the blocking agent 160 was 1.5%.

In addition, the encapsulation layer 140 was configured such that the weight ratio of the silicone was 95.5%, and the weight ratio of the phosphor 150 and the blocking agent 160 was 4.5%.

Figure 10G:
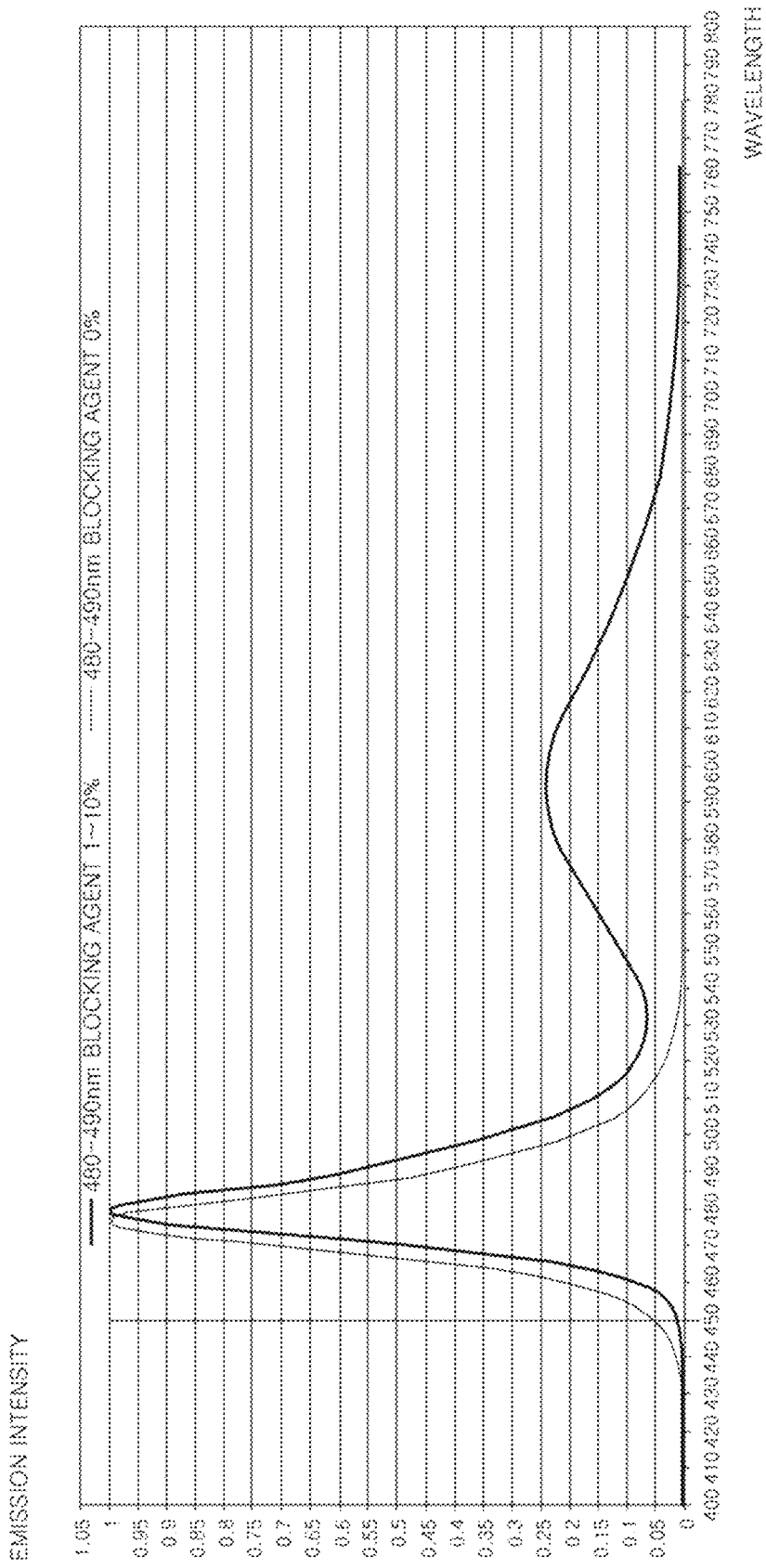

Therefore, as can be seen from FIG. 10G, in the white-light illumination apparatus 10 for limiting wavelength of 450 nm or less which is configured as described above, when the blocking agent 160 is not used, the light having the wavelength of 450 nm may be attenuated by up to 95.87% in comparison with the maximum value, and thus the light having the wavelength of 450 nm or less appears to significantly prevent the occurrence of error, but this configuration still cannot reach the level achieved when the blocking agent 160 is used. In contrast, it can be seen that the case in which the blocking agent 160 is used may block the light having the wavelength of 450 nm by up to 99.33%.

In the white light source 100 and the illumination apparatus 10 for limiting wavelength of 450 nm or less according to the exemplary embodiment of the present invention, white light can be implemented while limiting light wavelength of 450 nm or less, and the lithography or other process may be performed in the white lighting environment, and as a result, it is possible not only to prevent the problems of an increase in fatigue of operators, a deterioration in workability and efficiency, and a deterioration in visibility when the operator is exposed to the yellow lighting over a long period of time, but also to prevent an increase in manufacturing costs that may be incurred due to the additional process of mounting the wavelength shielding film or the like.

The above description is simply given for illustratively describing the technical spirit of the present invention, and those skilled in the art to which the present invention pertains will appreciate that various changes and modifications are possible without departing from the essential characteristic of the present invention. Therefore, the exemplary embodiments disclosed in the present invention are provided for illustrative purpose but not intended to limit the technical spirit of the present invention, and the present invention is not limited to the exemplary embodiments. The protective scope of the present invention should be construed based on the following claims, and all the technical spirit in the equivalent scope thereto should be construed as falling within the scope of the present invention. invention.

What is claimed is:

1. A white-light illumination apparatus for limiting wavelength of 450 nm or less, the white-light illumination apparatus comprising a white light source comprising:
   a blue light-emitting diode element having an emission peak wavelength of 450 nm to 490 nm; and
   an encapsulation layer configured to encapsulate the blue light-emitting diode element,
   wherein one or more phosphors, which implement white light emission together with the blue light-emitting diode element, and a blocking agent, which blocks light of wavelength of 450 nm or less, are distributed in the encapsulation layer to limit the wavelength of 450 nm or less while forming a first peak region at a wavelength of 450 nm to 490 nm and a second peak region combined with the first peak region to implement the white light emission,
   wherein the blocking agent comprises a chemical material selected from a porphyrin-based material, a phthalocyanine-based mount, and a coumarin-based material that comprises carbon (C), hydrogen (H), and nitrogen (N) as basic elements.

2. The white-light illumination apparatus of claim 1, wherein the blocking agent comprises a metallic material together with the chemical material.

3. The white-light illumination apparatus of claim 2, wherein the metallic material comprises one or two or more of vanadium (V), magnesium (Mg), chromium (Cr), manganese (Mn), indium (In), cobalt (Co), nickel (Ni), copper (Cu), zinc (Zn), sodium (Na), lithium (Li), aluminum (Al), silicone (Si), silver (Ag), tin (Sn), and titanium (Ti).

4. The white-light illumination apparatus of claim 3, wherein the blocking agent is made of porphyrin-vanadium.

5. The white-light illumination apparatus of claim 4, wherein a weight ratio of the blocking agent is within a range of 1% to 10% of an overall weight of the phosphor and the blocking agent.

6. The white-light illumination apparatus of claim 1, wherein the encapsulation layer comprises:
   a first phosphor having an emission peak wavelength of 500 to 560 nm; and
   a third phosphor having an emission peak wavelength of 621 to 670 nm.

7. The white-light illumination apparatus of claim 1, wherein the encapsulation layer comprises a second phosphor having an emission peak wavelength of 561 to 620 nm.

8. The white-light illumination apparatus of claim 1, wherein the encapsulation layer comprises a third phosphor having an emission peak wavelength of 621 to 670 nm.

9. The white-light illumination apparatus of claim 1, wherein the encapsulation layer comprises:
   a second phosphor having an emission peak wavelength of 561 to 620 nm; and
   a third phosphor having an emission peak wavelength of 621 to 670 nm.

10. The white-light illumination apparatus of claim 1, wherein the white-light illumination apparatus emits white light within a range of a correlated color temperature (CCT) of 2,700 K to 7,000 K.

11. The white-light illumination apparatus of claim 1, wherein the blue light-emitting diode element has an emission peak wavelength of 470 nm to 490 nm, and
   wherein one or two or more of a first phosphor having an emission peak wavelength of 500 to 560 nm, a second phosphor having an emission peak wavelength of 561 to 620 nm, and a third phosphor having an emission peak wavelength of 621 to 670 nm are distributed in the encapsulation layer without the blocking agent, such that the white light emission is implemented while limiting the light having the wavelength of 450 nm or less.

12. The white-light illumination apparatus of claim 1, further comprising:
a board mounted with the white light source;
a light transmitting member embedded with the board and configured to transmit light emitted from the white light source; and
a connecting member electrically connected to the board and configured to supply power for operating the white light source,
wherein the white-light illumination apparatus is implemented in the form of a fluorescent lamp or a flat plate.

13. A white light source for limiting wavelength of 450 nm or less, the white light source comprising:
a blue light-emitting diode element having an emission peak wavelength of 450 nm to 490 nm; and
an encapsulation layer configured to encapsulate the blue light-emitting diode element, wherein one or more phosphors, which implement white light emission together with the blue light-emitting diode element, and a blocking agent, which blocks light of a wavelength of 450 nm or less, are distributed in the encapsulation layer to limit the wavelength of 450 nm or less while forming a first peak region at a wavelength of 450 nm to 490 nm and a second peak region combined with the first peak region to implement the white light emission
wherein the blocking agent comprises a chemical material selected from a porphyrin-based material, a phthalocyanine-based mount, and a coumarin-based material that comprises carbon (C), hydrogen (H), and nitrogen (N) as basic elements.

14. The white light source of claim 13, wherein the blocking agent comprises a metallic material together with the chemical material.

15. The white light source of claim 14, wherein the metallic material comprises one or two or more of vanadium (V), magnesium (Mg), chromium (Cr), manganese (Mn), indium (In), cobalt (Co), nickel (Ni), copper (Cu), zinc (Zn), sodium (Na), lithium (Li), aluminum (Al), silicone (Si), silver (Ag), tin (Sn), and titanium (Ti).

16. The white light source of claim 15, wherein the blocking agent is made of porphyrin-vanadium.

17. The white light source of claim 16, wherein a weight ratio of the blocking agent is within a range of 1% to 10% of an overall weight of the phosphor and the blocking agent.

18. The white light source of claim 13, wherein the encapsulation layer comprises:
a first phosphor having an emission peak wavelength of 500 to 560 nm; and
a third phosphor having an emission peak wavelength of 621 to 670 nm.

19. The white light source of claim 13, wherein the encapsulation layer comprises a second phosphor having an emission peak wavelength of 561 to 620 nm.

20. The white light source of claim 13, wherein the encapsulation layer comprises a third phosphor having an emission peak wavelength of 621 to 670 nm.

21. The white light source of claim 13, wherein the encapsulation layer comprises:
a second phosphor having an emission peak wavelength of 561 to 620 nm; and
a third phosphor having an emission peak wavelength of 621 to 670 nm.

22. The white light source of claim 13, wherein the white-light illumination apparatus emits white light within a range of a correlated color temperature (CCT) of 2,700 K to 7,000 K.

23. The white light source of claim 13, wherein the blue light-emitting diode element has an emission peak wavelength of 470 nm to 490 nm, and
wherein one or two or more of a first phosphor having an emission peak wavelength of 500 to 560 nm, a second phosphor having an emission peak wavelength of 561 to 620 nm, and a third phosphor having an emission peak wavelength of 621 to 670 nm are distributed in the encapsulation layer without the blocking agent, such that the white light emission is implemented while limiting the light having the wavelength of 450 nm or less.

24. The white light source of claim 13, further comprising:
a board mounted with the white light source;
a light transmitting member embedded with the board and configured to transmit light emitted from the white light source; and
a connecting member electrically connected to the board and configured to supply power for operating the white light source,
wherein the white light source is implemented in the form of a fluorescent lamp.

* * * * *